United States Patent [19]

Yabe et al.

[11] 3,742,380

[45] June 26, 1973

[54] PN JUNCTION SEMICONDUCTOR OSCILLATOR DEVICE CONTROLLED BY LIGHT

[75] Inventors: Masaya Yabe; Masaru Kono; Teizo Takahama; Katsumi Hirono, all of Kawasaki, Japan

[73] Assignee: Fuji Denki Seizo Kabushiki Kaisha, Kanagawa-ken, Japan

[22] Filed: Nov. 8, 1971

[21] Appl. No.: 196,297

[30] Foreign Application Priority Data

Nov. 11, 1970 Japan........................ 45/97613

[52] U.S. Cl................. 331/66, 307/311, 317/235 N, 331/107 R, 331/108 D, 331/111

[51] Int. Cl............................ H03b 3/04, H03b 5/24

[58] Field of Search............. 331/66, 107 R, 108 D, 331/111; 317/235 N; 307/311

[56] References Cited

UNITED STATES PATENTS 3,665,340 5/1972 Kojima et al..................... 331/107 R

*Primary Examiner*—Roy Lake
*Assistant Examiner*—Siegfried H. Grimm
*Attorney*—Holman & Stern

[57] ABSTRACT

An oscillating device comprising a semiconductor oscillating element, an electric source connected to apply a voltage necessary for causing an oscillation to the element, a means for taking out the oscillation output of the element and a means for irradiating light to control the oscillation conditions of the element, said semiconductor oscillating element comprising a semiconductor wafer which comprises a first region of a conductivity type, a second region of a reverse conductivity type and a PN junction formed between said both regions, an injection electrode means provided on said first region at a specific distance from said second region, and an ohmic electrode means provided on said first region at specific distances respectively, from said second region and said injection electrode means. Various modifications and applications of said oscillating device are described.

8 Claims, 9 Drawing Figures

PN JUNCTION SEMICONDUCTOR OSCILLATOR DEVICE CONTROLLED BY LIGHT

BACKGROUND OF THE INVENTION

A semiconductor oscillating element has already been proposed, said element having: a semiconductor wafer comprising a first region of a conductivity type, a second region of a reverse conductivity type and a PN junction formed between said both regions; an injection electrode means provided on the first region at a specific distance from the second region; and an ohmic contact-electrode means provided on the first region at specific intervals, respectively, from the second region and the injection electrode means.

SUMMARY OF THE INVENTION

It is a primary object of the present invention to provide an oscillating device which is controlled by light, the device being characterized in that the abovementioned semiconductor oscillating element is photosensitive.

Specifically, it is an object of the present invention to provide an oscillating device, in which an oscillating frequency is continuously varied or an oscillation state is converted to nonoscillation state or vice versa by adjusting the intensity of light irradiated on the semiconductor oscillating element.

A further object of the present invention is to provide various modifications and their operating circuits of a semiconductor oscillating element, which can be used for the oscillating device.

A still further object of the present invention is to provide various applications of the oscillating device mentioned above.

These and other objects and features of the present invention will be better understood upon consideration of the following detailed description in conjunction with the accompanying drawings, in which the same or equivalent members are designated by the same reference numerals.

DETAILED DESCRIPTION OF THE INVENTION

Figure 1:
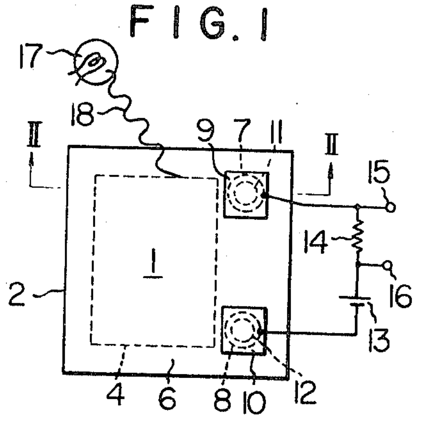
FIGS. 1, 3, 5 and 7 are plan views of different embodiments of the present invention, respectively.
Figure 2:
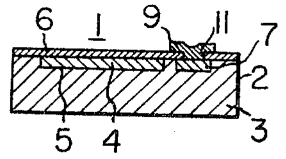
FIGS. 2, 4, 6 and 8 are sectional views of the semiconductor oscillating elements, sectioned along lines II—II, IV—IV, VI—VI and VIII—VIII shown in FIGS. 1, 3, 5 and 7, respectively.

With reference now to FIGS. 1 and 2, there is shown an oscillating device which comprises a semiconductor oscillating element 1 provided with a semiconductor wafer 2. The semiconductor wafer 2 comprises a first region 3 of a first conductivity type, a second region 4 of a second conductivity type which is opposite to said first conductivity type, and a PN junction 5 formed between said two regions. The semiconductor wafer 2 is, for instance, made of a monocrystal silicon sheet having a surface dimension of 2 × 2 mm and a thickness of about 200 $\mu$. The region 3 is, for instance, n type which is an original conductivity type of the wafer 2, and the region 3 has a specific resistance of 30 Ω-cm. The region 4 is a p type and is formed by selectively diffusing an element, (for instance, boron, which is from the third group of the periodic table) through an aperture through a $SiO_2$ film 6 formed on the surface of the semiconductor wafer 2, said region 4 having a surface area of 1 $mm^2$ and a thickness of about 3 $\mu$. A specific resistance of the region 4 along the surface of the wafer 2 is about 0.01 Ω-cm and is extremely lower than that of the region 3. The region 3 is provided additionally with regions 7 and 8 which are formed, as in the case of the region 4, by selectively diffusing an impurity element through holes opened through the $SiO_2$ film 6. The region 7 has the same conductivity type as that of the region 4, that is, p type in this example, and is formed simultaneously with the region 4 by diffusion of boron. The region 8 has the same conductivity type as that of the region 3, that is, n type, and is formed by diffusion of an element, (for instance, phosphorous which is from the fifth group of the periodic table), said region 8 having a low specific resistance. A distance, as viewed in section, between the region 8 and the region 4 is selected to be substantially the same as the diffusion length of minority carrier that is, positive hole in the region 3. More specifically, if the diffusion length of the minority carrier in the region 3 is in the range 80 to 140 $\mu$, a distance between the regions 4 and 7 is selected to be about 100 $\mu$ and a distance between the regions 4 and 8 is selected to be about 100 –200 $\mu$. A distance between the regions 7 and 8 is selected to be sufficiently large, for instance, to be approximately 850 $\mu$ in comparison with the diffusion length of the minority carrier in the region 3. Furthermore, the region 8 is formed so as to have a small diameter, for instance, about 50 $\mu$ so that electric flux may be concentrated in the vicinity of said region 8 when the device is operated.

The regions 7 and 8 make ohmic contact with electrodes 9 and 10 formed, for instance, by evaporation of aluminum through holes 11 and 12 opened in the oxide film 6, respectively. The region 7 and the electrode 9 form an injection electrode means adapted to inject positive holes into the N type region 3 when a forward bias voltage is applied to a PN junction provided between the regions 3 and 7; while the region 8 with the electrode 10 forms an ohmic contact-electrode means with respect to the region 3.

For the purpose of operating the semiconductor oscillating element 1 mentioned above, a voltage is applied across the electrodes 9 and 10 from an electric source 13 in such a manner that minority carriers are injected into the region 3 by the injection electrode means, that is, application of said voltage is conducted so that the polarity of the electrode 9 is positive with respect to the electrode 10 in this illustration. A resistor 14 is connected in series to the electric source 13, and an output voltage proportional to a current flowing through the electrodes 9 and 10 is produced across terminals 15 and 16 provided on both ends of said resistor 14.

A light source schematically shown as a lamp 17 and a wave-shaped line 18 is provided for irradiating the surface of the semiconductor oscillating element 1 by light emitted therefrom.

In operation of the device, a proper voltage is applied across the electrodes 9 and 10, and the intensity of light irradiated onto the semiconductor oscillating element 1 is adjusted. The light intensity may be varied continuously or stepwise by means of conventional means (not shown). The light source 17 may be, of course, either of a flashing or of blinking type. The light intensity may be controlled by variation of the brightness of the light source 17 or by use of a substance interposed between the light source 17 and the semiconductor oscillating element. of a In order to help understanding the operation of the device under light irradiation, the operation of the device in the dark is, at first, described hereinafter: no light is irradiated from the light source 17, that is, the semiconductor oscillating element 1 is placed in a dark room.

Let it be assumed that a voltage applied between the electrodes 9 and 10 is gradually increased from zero. In this case, so long as the applied voltage is below a lower limit value, a small d.c. current flows between the electrodes 9 and 10 and therefore only a small voltage is produced between the terminals 15 and 16. However, as soon as the applied voltage exceeds the lower limit value, an oscillating current superimposed on the d.c. current flows through the electrodes 9 and 10. Thereby a voltage proportional to the thus superimposed current appears across the terminals 15 and 16. With further increase of the applied voltage the frequency of the oscillating current continuously increases. When said applied voltage exceeds an upper limit value, the oscillating current disappears and only a large d.c. current flows.

For example, in one embodiment, the lower limit value at which superimposition of the oscillating current appears was approximately 2 V, and the upper limit value at which the oscillating current disappears was approximately 80 V. The oscillating frequency varied continuously from 0.8 MHz to 1.5 MHz.

Next, when light from the light source 17 is irradiated on the surface of the element 1, the following phenomena are observed: the lower limit value of the applied voltage at which superimposition of the oscillating current starts is lowered, and the oscillating frequency is increased compared with that in the dark, when the applied voltage is kept at a sufficient value to cause oscillation of the current flowing through the element 1.

Accordingly, the device shown in FIG. 1 can carry out the following various operations.

One of the operations is that, when the element 1 is placed in the dark room or in a room having a low intensity of illumination, a voltage slightly lower than the lower limit value of the applied voltage at which superimposition of the oscillating current starts is applied across the electrodes 9 and 10 of the element 1. A device utilizing this principle operates in such a manner that, while no oscillating voltage appears with the null or weak intensity of the light irradiated on the element 1, the oscillating voltage is produced, when the intensity of light is increased through a critical value. Therefore, the device can be utilized as, for instance, a fire alarm, or a device which issues a signal when the device is irradiated by light with proper intensity or by light with increased intensity.

Furthermore, the device can be used as a detector which detects approach of a substance having a light-reflecting characteristic. In this case, further means are provided (not shown) so that the light from the light source 17 may not directly reach the semiconductor oscillating element 1, but the light reflected by the approaching substance reaches the element 1.

In addition, the device can be utilized as a detector which serves to detect slits or fissures of a non-transparent or semitransparent, band-shaped material in the field of a continuous production of a band-shaped member.

The second of the operations is opposits to the first operation described above, that is, when a light with a certain light-intensity is irradiated on the element 1, a voltage slightly higher than the lower limit value of the applied voltage at which the oscillating current appears is applied across the electrodes 9 and 10. A device utilizing the principle of said second operation operates in such a manner that an oscillating voltage is produced as long as the illumination intensity of the light irradiated on the element 1 is above a threshold intensity, but said oscillating voltage disappears when the illumination intensity of the light decreases below the threshold intensity.

Therefore, the device can be utilized as a device, for instance, an automatic on-off means of a street lamp which starts its operation with decrease of outdoor light intensity.

Furthermore, when the element 1 is made of silicon it has a maximum sensitivity for light at a wavelength 0.92$\mu$m, i.e., an infrared ray, it can be used as a light barrier. In addition, the element can be adapted for use in an automatic counter provided in a belt conveyor system.

The third of the operations is that, the oscillating frequency varies with variation of the illumination intensity when the voltage across the electrodes 9 and 10 is kept within a range from the upper to the lower limit voltage.

A device utilizing said third operation operates as a kind of analog to digital converter which converts the illumination intensity of an irradiated light into an oscillating frequency. Therefore, the device can be utilized in various kinds of measuring and controlling devices which serve to convert an input light signal into an electrical output signal.

Figure 9:
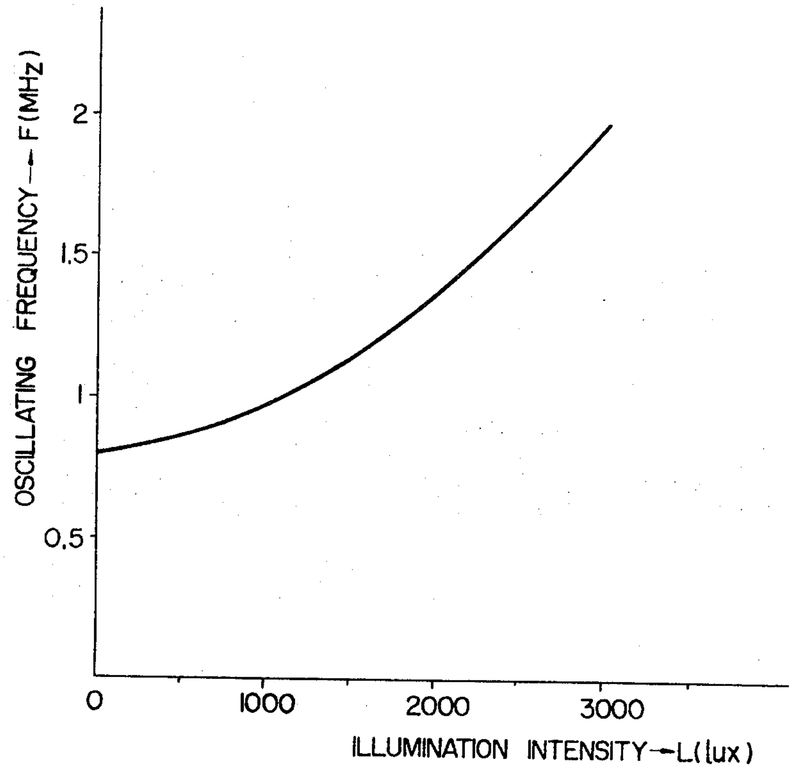
FIG. 9 is a graphic diagram showing an operating characteristic of the oscillating device shown in FIG. 1.

FIG. 9 shows a graphic diagram illustrating a photosensitivity characteristic curve of a semiconductor oscillating element 1 that is, variation of the oscillating frequency due to variation of the illumination intensity, in which the abscissa represents the illumination intensity L(lux) at the surface of the element 1 and the ordinate represents the oscillating frequency F(MHz).

It is considered that, in the semiconductor oscillating element 1 shown in FIGS. 1 and 2, the decrease of the lower limit of the applied voltage for the oscillating current and the increase of the oscillating frequency by irradiation of light on the surface of the element 1 are due to the following reasons:

At a moment when a voltage is applied across the electrodes 9 and 10 of the semiconductor oscillating element 1, a rush current flows from the region 7 through the region 3 to a capacitor utilizing as its insulating layer the pn junction 5 formed between the regions 3 and 4, and further from the side edge portion of the region 4, confronting to the region 8, to the region 8 through the region 3. When the voltage of the electric source 13 is sufficiently high, a conductivity modulation is caused by positive holes injected into the region 3 from the side edge portion of the region 4, confronting to the region 8, upon flow of the above-mentioned rush current, whereby potential of the region 4 is rapidly decreased, thus causing quick charging of the capacitor. With a lapse of time, charge of the capacitor increases while the charging current decreases. When this charging current becomes lower than a certain value, the conductivity modulation ceases and the current decreases to a small residual current. On the other hand, some part of the positive holes injected from the region 7 into the region 3 diffuses into the region 4 through the region 3. In this case, since the distance between the regions 7 and 4 is substantially as large as the diffusion length of the positive holes, the quantity of the positive holes flowing into the region 4 is relatively small. Therefore the action of said holes is not significant during the rush current process. However, potential of the region 4 is negative with respect to the region 3 even after the rush current disappears, so that transferring of the holes into the region 4 is continued and potential of the region 4 increases gradually. When this potential reaches a certain upper limit value, holes are injected into the region 3 from the side edge portion of the region 4, confronting to the region 8. Therefore conductivity modulation is caused and a current flowing to the region 8 from the region 7 through the region 3 increases rapidly.

Now, phenomena caused upon irradiation of light on the surface of the element 1 will be taken in consideration. When light is irradiated on the surface of the element 1, pairs of electrons and holes are produced in the semi-conductor wafer 2 by energy of the light, and electrons and holes produced in the vicinity of the PN junction 5 formed between the regions 3 and 4 are transferred into the regions 4 and 5 by a voltage applied to the junction 5, respectively, whereby potential of the region 4 which has been lowered by the rush current is increased rapidly. This phenomenon is effective for increasing the oscillating frequency. Furthermore, the light conductivity modulation is caused by the irradiated light, whereby the quantity of injection of holes transferring from the region 4 to the region 8 through the region 3 is increased. This phenomenon is effective for increasing the oscillating frequency, and further for decreasing the lower limit value of a voltage at which superimposition of the oscillating current starts because of the appearance of the rush current at a lower value of the applied voltage.

Figure 3:
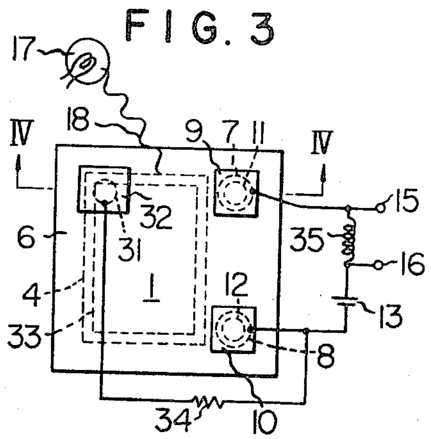
Figure 4:
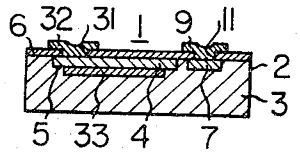

A device shown in FIGS. 3 and 4 is different from the device shown in FIGS. 1 and 2 in the construction of the semiconductor oscillating element 1; that is, in the device shown in FIGS. 3 and 4, another hole 31 is formed in the oxide film 6 and an electrode 32 formed by evaporation of a metal, for instance, aluminum makes an ohmic contact with the region 4 through said hole 31. In addition, a region 33 having the same conductivity as the region 3, for instance, N type, and a low specific resistance is formed in such a manner that said region 33 is interposed between the regions 3 and 4.

The electrode 32 is connected to the electrode 10 through a resistor 34. The resistor 34 is employed for the purpose of setting an oscillating frequency to a proper value or for the purpose of varying the oscillating frequency of the element 1 in response to a physical quantity influencing on the resistance value of said resistor 34.

The resistor 34 affects the oscillating frequency as follows; any oscillation would not occur unless the resistance value of the resistor 34 is larger than a predetermined several hundred kΩ, and when said resistance value is increased to a value above said predetermined value, an oscillation occurs and frequency of this oscillation increases rapidly and then gradually becomes constant.

The resistor 34 can be connected between the electrodes 32 and 9. In this case, it is possible to produce an oscillation by adjusting resistance value of said resistor 34 to a value more than several kΩ to several 10 kΩ, but frequency of the oscillation decreases gradually with increase of the resistance value.

It is also possible to connect a capacitor in place of the resistor 34. In this case, a terminal of the capacitor whose opposite terminal is connected to the electrode 32 may be connected to either the electrode 9 or the electrode 10, and in both cases an oscillating frequency decreases greatly with increase of the capacitance value of said capacitor. Furthermore, it may be possible to connect a voltage source in place of the resistor 34. In this case, when the polarity of the voltage source corresponds to a forward bias with respect to a PN junction between the regions 3 and 4, the oscillating frequency increases, and when said polarity corresponds to a reverse bias the oscillating frequency decreases.

The region 33 having a low specific resistance occupies a part of the pn junction between the regions 3 and 4, and suppresses widening of a depletion layer toward the region 3 when a reverse bias voltage is applied to the PN junction during the operation of the element 1, whereby the static capacity of the capacitor having the PN junction 5 as its insulating layer is maintained at a large value. Therefore, if each dimension of the element is assumed to be equal, an oscillating frequency lower than that provided by the element 1 shown in FIGS. 1 and 2 can be obtained, and on the other hand if the oscillating frequency is assumed to be equal, the element can be made smaller in dimension.

Furthermore, in this device, an inductance 35 is connected in series with the electric source 13. The waveform of an output voltage produced between the terminals 15 and 16 is made smoother by connecting the inductance 35 in place of the resistance 14 shown in FIG. 1.

In the device, an oscillating frequency is set within a proper range by connection of the above described circuit element between the electrode 32 and the electrode 9 or 10, and on the other hand the same operation as explained with reference to the device shown in FIG. 1 is carried out by control of the light quantity irradiated on the surface of the element 1. In addition to this, both by the light and by the circuit element, the oscillating frequency is controlled and the oscillation condition is varied from appearing to disappearing or vice versa.

Figure 5:
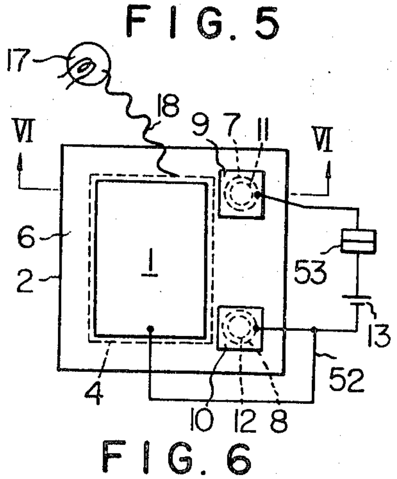
Figure 6:
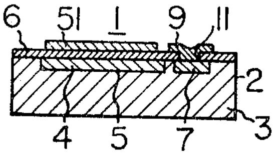

A semiconductor oscillating element 1 used in a device shown in FIGS. 5 and 6 is different from that in the device shown in FIGS. 1 and 2 in that a metal foil 51 having a relatively large area is provided on the oxide film 6. The foil 51 is formed by evaporation of a metal, for instance, aluminum, thus forming a kind of capacitor with the region 4, said capacitor utilizing the oxide film 6 as its insulating layer. The foil 51 is further connected to the electrode 10 through a conductor 52, and said capacitor is connected in parallel to the capacitor formed between the regions 3 and 4 with an insulating layer, namely, and PN junction 5. Therefore, for a given dimension of the element, an oscillating frequency lower than that produced by the element 1 shown in FIGS. 1 and 2 can be obtained by rising that in FIGS. 5 and 6. In addition, for a given oscillating frequency the dimension of the element can be made smaller by rising the arrangements of FIGS. 5 and 6.

Furthermore, in this device shown in FIGS. 5 and 6, an electroluminescent diode 53 is connected in series with the electric source 13. Accordingly, a flickering light responsive to an oscillating current flowing through the electrodes 9 and 10 can be obtained as an output of the device. Sometimes, the direct conversion of the output signal into physical quantities except voltage is preferable. The following is an example of this kind of use:

If an electromagnet is connected in place of the electroluminescent diode 53, a periodically increasing and decreasing magnetic flux can be obtained as its output. The device is also used fundamentally in the same way as in the device shown in FIGS. 1 and 2.

Figure 7:
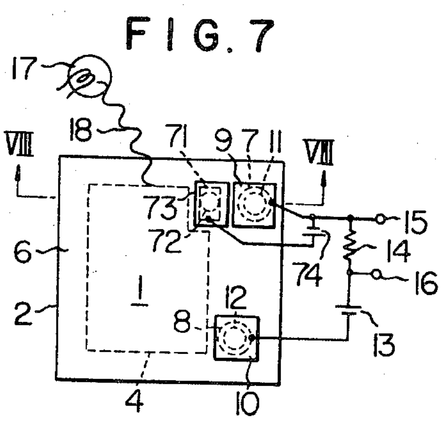
Figure 8:
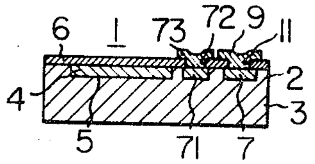

A semiconductor oscillating element shown in FIGS. 7 and 8 is different from the previously mentioned ones in that a region 71 having the same conductivity as the region 3 and a low specific resistance is provided at a portion between the regions 7 and 4, and an electrode 73 formed, for instance, by evaporation of a metal is brought into ohmic contact with said region 71 through a hole 72 opened through the oxide film 6.

Another electric source 74 is connected between the electrodes 73 and 9. This electric source 74 serves to control the quantity of minority carriers injected from the region 7 to the region 3 thereby adjusting or setting an oscillating frequency. As shown in FIG. 7, in the case when the polarity of the electric source is set so as to suppress the injection of the minority carriers to the region 3 from the region 7, the oscillating frequency decreases with increase of an applied voltage and the oscillation is ceased when the applied voltage exceeds a certain value. If the polarity of the electric source is reversed, the oscillating frequency increases with increase of the applied voltage.

The conductivity type of the region 71 may be opposite to that of the region 3. In this case, if a voltage corresponding to a reverse bias with respect to pn junction formed between the regions 71 and 3 is applied across the electrode 9 and the electrode 73 having ohmic contact with the region 71 thereby withdrawing the minority carrier injected from the region 7, the oscillating frequency is decreased or the oscillation is ceased.

In this device, the voltage source 74 is used for the purpose of setting the oscillating frequency of the semiconductor oscillating element 1 to a proper value, or for the purpose of controlling the oscillating frequency of an output voltage, in combination with the quantity of light irradiated on the surface of the element 1 in the case when the voltage and/or polarity of said voltage source is controlled in response to the same controlling quantity.

In the embodiments mentioned above, silicon is used for the semiconductor, but other semiconductive materials such as germanium, metallic compound and the like may be used for preparing the semiconductor. Furthermore, in the embodiments mentioned above, a conductivity type region and a reverse conductivity type region are made, respectively, to be N type and P type, but their conductivity types may be reversed. In addition, a heterojunction may be utilized as the injective electrode means in the place of the PN junction.

We claim:

1. An oscillating device controlled by a light beam, comprising: a semiconductor oscillating element which includes a semiconductor wafer having a first region of a conductivity type, a second region of a reverse conductivity type, a PN junction being formed between said first and second regions, an injection electrode means disposed near said second region, on said first region at a distance substantially equal to a diffusion length of minority carrier in the first region for injecting minority carriers into said first region, and an ohmic electrode means provided near said second region, on said first region at a distance substantially equal to the diffusion length of said minority carrier, for applying a potential to said second region, said ohmic electrode means being disposed at a distance substantially longer than said diffusion length from said injection electrode means; and electric source which applies a voltage between said both electrode means so that minority carriers are injected to said first region from said injection electrode means; means for taking out an output electrical oscillation produced by said oscillating element; and a means irradiating light on a surface of said oscillating element.

2. An oscillating device according to claim 1, in which a resistor having two terminals is connected in series with the electric source, the terminals of said resistor being used for deriving an output voltage.

3. An oscillating device according to claim 1, in which an additional electrode is formed in ohmic contact with the second region, and an additional region having the same conductivity as the first region and having a specific resistance lower than that of said first region is interposed between said first and second regions, said additional electrode being connected to one of the other electrodes through a resistor.

4. An oscillating device according to claim 3, in which an inductance is connected in series with the electric source.

5. An oscillating device according to claim 1, which includes an insulating oxide film deposited on said second region, and in which the second region is formed by selective diffusion through a hole in the oxide film formed on the semiconductor wafer, and in which a metallic film having a wide area formed on said oxide film is additionally provided, said metallic film forming a capacitance together with said second region and said oxide film, said metallic film being connected to one of the electrodes.

6. An oscillating device according to claim 5, in which a light producing diode is connected in series with the electric source.

7. An oscillating device according to claim 1, in which the semiconductor oscillating element is provided additionally with a low resistive region of the same conductivity type as the first region, said low resistive region being provided between said second region and said injection electrode means, and with an electrode formed on said low resistive region to have ohmic contact with said low resistive region.

8. An oscillating device according to claim 1, in which an additional electrode is formed in ohmic contact with said second region, and an additional region of the same type conductivity as the first region and having a specific resistance lower than that of said first region is interposed between said first and second regions, said additional electrode being connected to one of the other electrodes through a capacitor.

* * * * *